United States Patent [19]

Ohgishi et al.

[11] 4,201,945
[45] May 6, 1980

[54] PHASE COMPARING APPARATUS

[75] Inventors: Tsutomu Ohgishi, Yahata; Toru Akiyama; Tadashi Sakurai, both of Neyagawa, all of Japan

[73] Assignee: Sanyo Electric Co., Ltd., Moriguchi, Japan

[21] Appl. No.: 903,789

[22] Filed: May 8, 1978

[30] Foreign Application Priority Data

May 20, 1977 [JP] Japan .................................. 52/60183
May 20, 1977 [JP] Japan .................................. 52/60184

[51] Int. Cl.² ............................................. H04B 1/06
[52] U.S. Cl. ............................. 455/183; 331/DIG. 2; 331/25; 328/133; 455/260
[58] Field of Search .................... 358/191, 193, 195; 325/419, 423, 464, 418, 421, 422, 468; 331/17, 25, 27, DIG. 2; 307/232, 233 R; 328/133, 148, 109, 110; 324/83 R, 83 D, 832

[56] References Cited

U.S. PATENT DOCUMENTS

| 3,080,533 | 3/1963 | Edwards | 331/DIG. 2 |
| 3,521,182 | 7/1970 | Stuex | 331/DIG. 2 |
| 3,982,190 | 9/1976 | Schaefer | 325/419 |
| 3,988,696 | 10/1976 | Sharpe | 328/133 |
| 4,122,405 | 10/1978 | Tietz et al. | 307/232 |

OTHER PUBLICATIONS

Sharpe, A. C. "How Can You be Sure That Your PLL is Really Locked In?" EDN, Feb. 20/77, vol. 22, No. 4.

Primary Examiner—Robert L. Griffin
Assistant Examiner—Alexander Gerasimow
Attorney, Agent, or Firm—Darby & Darby

[57] ABSTRACT

A lock detecting circuit of a phase locked loop, comprising a phase comparator for receiving a reference frequency signal and a signal being compared with the reference frequency signal, a charging/discharging circuit which is charge/discharge controlled responsive to the output of the phase comparator and either of the above described two signals, and a delay flip-flop responsive to the output of the charging/discharging circuit and in synchronism with the signal applied to the charging/discharging circuit for assuming one storing state for providing an output representative of the phase difference between the above described two signals.

20 Claims, 10 Drawing Figures

Prior Art

PHASE COMPARING APPARATUS

BACKGROUND OF THE INVENTION

1. Field of the Invention

The present invention relates to a phase comparing circuit. More specifically, the present invention relates an improved circuit configuration for a phase comparing circuit suited for a lock detecting circuit of a phase locked loop.

2. Description of the Prior Art

Recently radio receivers employing a so-called digital frequency synthesizer using a phase locked loop as a local oscillator have been proposed and put in practical use. FIG. 1 shows a block diagram of such a radio receiver employing a digital frequency synthesizer as a local oscillator. Referring to FIG. 1, a tuning and detecting circuit 100 is connected to receive a high frequency signal received by an antenna AT and to provide an audio signal output. The tuning and detecting circuit 100 is structured to comprise a voltage controlled oscillator 1 as a local oscillator. The output signal from the tuning and detecting circuit 100 is applied to an audio amplifier 101, where the signal is amplified. The output of the audio amplifier 101 is applied to a speaker 102. As well known, in a digital frequency synthesizer radio receiver, a local oscillator is implemented by a voltage controlled oscillator, which is connected as part of a phase locked loop such that the oscillation frequency is controlled by the phase locked loop.

The phase locked loop shown in FIG. 1 comprises a phase comparator 5 structured to compare the phase of the output of a frequency divider 2 for frequency dividing at a given frequency division rate 1/n the output of the reference oscillator 3 the oscillation frequency of which is fr and the phase of the output $\theta V$ of a programmable frequency divider 4 frequency dividing at a variable frequency division rate 1/N the output of the above described voltage controlled oscillator 1 oscillating at the frequency F0. Comparator 5 produces a voltage signal proportional to the phase difference, which is applied to a low pass filter 6, where the phase difference output signal is filtered to provide a direct current output, which is fed back to the voltage controlled oscillator 1 as a voltage control signal. In such a phase locked loop, the oscillation frequency f0 of the voltage controlled oscillator 1 and the oscillation frequency of the reference oscillator fr meet the relation F0=N/n·fr, if and when the phase locked loop is in a stabilized condition or in a phase locked state. In order to change the local oscillation frequency, it is necessary to change the frequency division rate of the programmable frequency divider. Accordingly, the data concerning the broadcasting frequencies of various broadcasting stations is stored in advance in a memory 7. The data corresponding to the broadcasting frequency of a desired broadcasting station is selectively read out from the memory 7, responsive to selection of the desired channel by a channel selection circuit 8, and is supplied to the programmable frequency divider 4 such that the frequency division rate by the frequency divider 4 is set to a desired value, whereby preset channel selection of a desired broadcasting station can be achieved. If desired, the data as read from the memory 7 is displayed by a display 9, whereby the frequency as received is displayed.

In such frequency synthesizer radio receivers, fluctuation of the source voltage, noise in the phase locked loop, and the like could cause a phase difference between the reference frequency signal $\theta R$ as frequency divided by the frequency divider 2 of the output from the reference oscillator 3 and the frequency signal $\theta V$, as frequency divided by the frequency divider 4, of the output from the voltage controlled oscillator 1 in association with the broadcasting frequency. This phase difference causes the phase locked loop to be unlocked. However, an error voltage associated with the said phase difference is applied to the voltage controlled oscillator 1, whereby the phase locked loop is locked again. In general, if and when the phase locked loop is unlocked because of a low frequency noise, the phase difference between the frequency signals $\theta V$ and $\theta R$ is relatively small and the phase locked loop is readily locked again, without causing a substantial affect on an audio circuit. On the other hand, if and when the receiving frequency is changed to select a desired broadcasting station, for example, a longer time period, referred to as a lock up time, is required until the phase locked loop is locked again and a noise other than a desired sound is heard from the speaker.

According to a conventional approach, therefore, when a phase difference exceeding a predetermined value occurred between the frequency signals $\theta V$ and $\theta R$, i.e. the phase locked loop is in an unlocked state, the signal associated with the phase difference is withdrawn by a low pass filter 10 and the output VUL of the low pass filter 10 is applied to a display 11 to display the unlocked state and is also applied to the audio amplifier 101 to achieve a muting operation.

FIG. 2 shows a schematic diagram of a conventional lock detecting circuit of a phase locked loop utilizing such a low pass filter. Referring to FIG. 2, if and when no phase difference exists between the frequency signals $\theta R$ and $\theta V$ to be applied to the phase comparator 5, the output of the phase comparator 5 becomes zero and the terminal voltage of a capacitor 12 is the high level, while the output VUL of an inverter 13 representing an unlock detected output is the low level. If and when a phase difference exists between the frequency signals $\theta R$ and $\theta V$, an MOS transistor 14 is rendered conductive during a time period corresponding to a phase difference responsive to the output of the phase comparator 4. This has the result that the capacitor 12 is discharged with a time constant determined by a conduction resistance value RT of the MOS transistor 14 and the capacitance value C of the capacitor 12. If and when the terminal voltage of the capacitor 12 is decreased lower than the threshold level of the inverter 13 through the above described discharging operation of the capacitor 12, the output VUL of the inverter 13 representing an unlock detected output is reversed to the high level, thereby to indicate an unlocked state of the phase locked loop. The MOS transistor 14 is reversed to a non-conduction state after the same is rendered conductive during a timing period corresponding to the above described phase difference and as a result the capacitor 12 is charged with a time constant determined by a resistance value R of a resistor 15 and the capacitance value C of the capacitor 12. If and when a phase difference still exists even upon receipt of the following pulse signal, the MOS transistor 14 is again rendered conductive and the capacitor 12 is discharged. In other words, according to a conventional lock detecting circuit utilizing a low pass filter, an unlocked state of the phase locked loop is detected in the form of discharging of the capacitor 12, whereby the state is stored for a time period corresponding to the charging time constant of the capacitor 12, which means that the conventional lock detecting circuit achieves two functions of lock detection and lock storing.

Meanwhile, it is necessary to make large to some extent the charging time constant of the capacitor 12, thereby to make large a storing time period. Thus, even when a phase difference is detected with respect to the frequency signal $\theta R$ at a given time point and the output VUL of the inverter 13 is reversed to the high level the terminal voltage of the capacitor may not be increased to reverse the output VUL of the inverter 13 to the low level until the following pulse signal $\theta R$ is received and the phase difference is detected again with respect to the said pulse. In general, it is necessary to increase the charging time constant of the capacitor 12 to be more than ten times larger than the cycles of the frequency signals $\theta R$ and $\theta V$. This means that the capacitance value of the capacitor 12 must be increased. On the other hand, from the standpoint of the detecting sensitivity, i.e. the possible detectable minimum phase difference between the frequency signals $\theta R$ and $\theta V$, an increase of the capacitance value of the capacitor means an increase of a discharging time constant and a decrease of the detection sensitivity. Accordingly, in a conventional lock detecting circuit employing a low pass filter, either a detecting function or a storing function had to be sacrificed. Another problem caused by an increase of the capacitance value of the capacitor 12 by preferring the storing function to the detecting function makes it difficult to fabricate the capacitor 12 of a large capacitance value when the phase locked loop and the lock detecting circuit is implemented in an integrated circuit.

SUMMARY OF THE INVENTION

According to one aspect of the present invention, there is provided a phase comparing apparatus, comprising: means for providing a first frequency signal of a reference frequency, means for providing a second frequency signal of a frequency or phase being compared with that of the first frequency signal, phase comparator means responsive to the first and second frequency signal providing means for comparing the frequencies or phases of the first and second frequency signals for providing an output representative of a frequency difference or a phase difference between the first and second frequency signals, charging/discharging circuit means responsive to one of the first and second frequency signal providing means for being forced to one of the charged and discharged states and responsive to the output of the phase comparator means for being forced toward the other of the charged and discharged states at a predetermined time constant as a function of the output of the phase comparator means, and state storing means coupled to the charging/discharging circuit means and the said one of the first and second frequency signal providing means and responsive to a predetermined level between said one and the said other of the charged and discharged states of the charging/discharging circuit means and the said one of the first and second frequency signals for assuming one storing state for providing an output representative of the frequency difference or phase difference between the first and second frequency signals.

According to another aspect of the present invention, there is provided a phase comparing apparatus, comprising: means for providing a first frequency signal of a reference frequency, means for providing a second frequency signal of a frequency or phase being compared with that of the first frequency signal, phase comparator means responsive to the first and second frequency signal providing means for comparing the frequencies of phases of the first and second frequency signals for providing an output representative of a frequency difference or a phase difference between the first and second frequency signals, charging/discharging circuit means responsive to one of the first second frequency signal providing means for being forced to one of the charged and discharged states and responsive to the output of the phase comparator means for being forced toward the other of the charged and discharged states at a predetermined time constant as a function of the output of the phase comparator means, and means for providing a third frequency signal of frequency lower than those of the first and second frequency signals. There is also included a first state storing means coupled to said charging/discharging circuit means and said third frequency signal providing means and responsive to a predetermined level between said one and said other of charged and discharged states of the charging/discharging circuit means for assuming a first storing state and responsive to the third frequency signal for assuming a second storing state, and second state storing means responsive to the output of the first state storing means and the third frequency signal for assuming one storing state for providing an output representative of the frequency difference or phase difference between the first and second frequency signals.

Preferably, the phase comparing apparatus further comprises means operatively coupled to the first and second frequency signal providing means for changing the frequencies of the first and second frequency signals, and means operatively coupled to the frequency changing means for changing the predetermined time constant of the charging/discharging circuit means.

Accordingly, a principal object of the present invention is to provide an improved phase comparing apparatus, wherein a means for detecting the frequency difference or phase difference between a first and second frequency signals and a means for storing the detected output are separately provided.

Another object of the present invention is to provide an improved phase comparing apparatus comprising a phase comparator for comparing the phases of a first and second frequency signals and a charging/discharging circuit including a capacitor responsive to the phase comparator and either of the first and second frequency signals to be charge/discharge controlled, wherein the capacitance value of the capacitor is decreased.

A further object of the present invention is to provide an improved phase comparing apparatus comprising a phase comparator for comparing the phases of a first and second frequency signals, a charge/discharge circuit including a capacitor responsive to the output of the phase comparator and either of the first and second frequency signals to be charge/discharge controlled, particularly adapted for implementation in an integrated circuit.

Still a further object of the present invention is to provide an improved phase comparing apparatus, particularly adapted for a phase locked loop.

Still another object of the present invention is to provide an improved phase comparing apparatus, particularly adapted for a phase locked loop to be employed in a receiver.

A further object of the present invention is to provide an improved phase comparing apparatus, particularly adapted for a phase locked loop to be employed in a multiband receiver.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
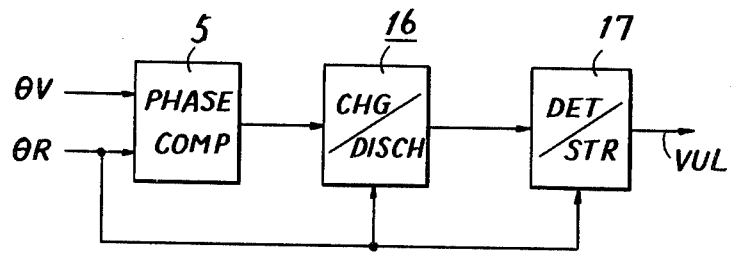
FIG. 3 shows a block diagram of one embodiment of the inventive lock detecting circuit wherein a detecting circuit and a storing circuit are separated.

Briefly described, the inventive lock detecting circuit is characterized by separate provisions of an unlocked state detecting scheme and an unlocked state storing scheme. FIG. 3 shows a block diagram of such a lock detecting circuit. Referring to FIG. 3, the embodiment shown comprises a phase comparator 5 for comparing the phases of the frequency signals $\theta R$ and $\theta V$, a charging/discharging circuit 16 operable responsive to the output of the phase comparator 5 and the frequency signal $\theta R$ and a detection/storing circuit 17 operable responsive to the output of the charging/discharging circuit 16 and the frequency signal $\theta R$. The frequency signals $\theta R$ and $\theta V$ are applied to the phase comparator 5, where the phases of the frequency signals $\theta R$ and $\theta V$ are compared to detect the phase difference therebetween. The output of the phase comparator 5 is applied to the charging/discharging circuit 16, where a charging (or a discharging) operation is carried out responsive to the output of the phase comparator 5 for a time period associated with the phase difference between the frequency signals $\theta R$ and $\theta V$ and a charging (or a discharging) operation is effected in synchronism with the frequency signal $\theta R$. The detection/storing circuit 17 is responsive to the output of the charging/discharging circuit 16 and the frequency signal $\theta R$ to detect whether the charging (or the discharging) operation was effected based on the phase difference by each predetermined period of the frequency signal $\theta R$ and to store the detected output.

Figure 4:
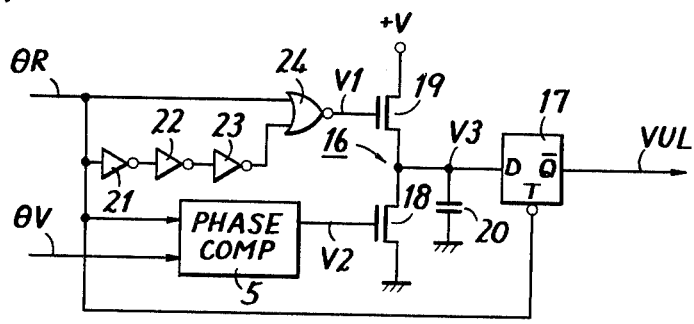
FIG. 4 shows a schematic diagram of the FIG. 3 embodiment.
Figure 5:
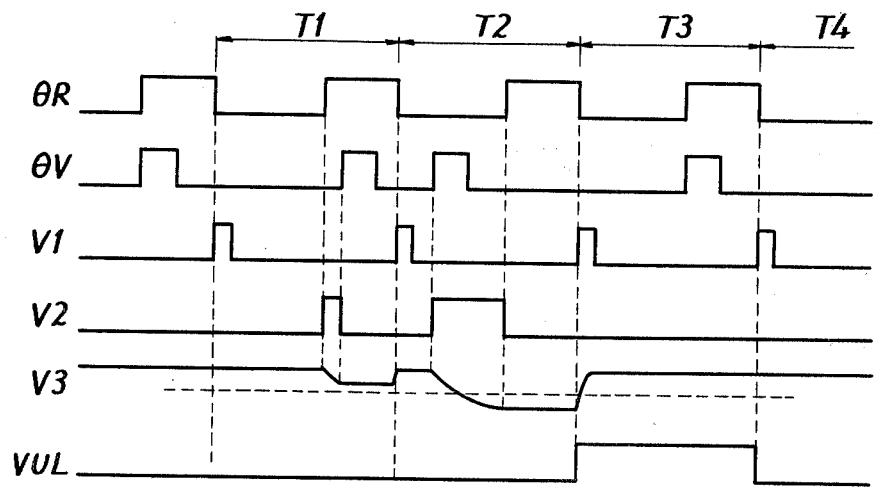
FIG. 5. shows wave forms of the electrical signals at various portions in the FIG. 4 embodiment.

FIG. 4 shows a schematic diagram of the FIG. 3 lock detecting circuit. FIG. 5 shows the wave forms of the electrical signals at various portions in the FIG. 4 diagram. With simultaneous reference to FIGS. 4 and 5, detailed description will be made of the present invention in the following. Referring to FIG. 4, the phase comparator 5 is responsive to the frequency signals $\theta R$ and $\theta V$ to provide a signal V2 assuming the high level for a time period related with the phase difference, i.e. a time period from the rise of the frequency signal $\theta R$ to the fall of the frequency signal $\theta V$. The charging/discharging circuit 16 is implemented by two MOS transistors 18 and 19 and a capacitor 20, wherein the capacitor 20 is discharged through the MOS transistor 18 which is rendered conductive when the signal V2 becomes the high level, i.e. when the phase difference occurs. The detecting/storing circuit 17 is implemented by a delay type flip-flop, which serves to detect the terminal voltage V3 of the capacitor 20 at each predetermined period, i.e. at each fall of the frequency signal $\theta R$, and to store the detected signal. If and when the terminal voltage V3 of the capacitor 20 decreases lower than the threshold level, as shown by the dotted line, of the delay input terminal of the delay type flip-flop 17 by virtue of a discharging operation based on the phase difference, the $\overline{Q}$ output VUL of the delay type flip-flop 17 representing an unlock detected output becomes the high level.

As is apparent from the foregoing description, the detection sensitivity of the phase difference is determined by the time constant determined by the capacitance value of the capacitor 20 and the resistance value of the MOS transistor 18 when the same is in conduction and the threshold level of the delay input terminal of the delay type flip-flop 17. A combination of inverters 21, 22 and 23 and a NOR gate 24 constitute a circuit for providing a pickup signal V1 representative of the fall of the frequency signal $\theta R$, wherein the signal V1 assumes the high level for a time period commensurate with a delay time caused by three inverters. The high level output of the signal V1 is applied to the MOS transistor 19 and when the transistor 19 is rendered conductive the capacitor 20 is charged through the transistor 19. It is required that the charging operation be carried out in a rapid manner. More specifically, it is necessary that the terminal voltage V3 of the capacitor 20 be returned to the original high level before the following pulse of the frequency signal $\theta R$ is received and the detection of the phase difference is carried out with respect to the said following pulse. Accordingly, the resistance value of the MOS transistor 19 when the same is in conduction is selected to be small. On the other hand, the pulse width of the frequency signal $\theta R$ must be sufficiently large with respect to the detection sensitivity.

Now referring to FIG. 5, during the time period T1, the phase difference between the frequency signals $\theta R$ and $\theta V$ is small and the discharging time period of the capacitor 20 by virtue of the signal V2 is short. Therefore, the terminal voltage V3 of the capacitor 20 does not decrease lower than the threshold level of the delay type flip-flop 17 and the unlock detected output VUL remains at the low level. The MOS transistor 19 becomes conductive responsive to the pickup signal V1 immediately after the said time period T1 and the capacitor 20 is rapidly charged through the transistor 19, whereby the terminal voltage V3 of the capacitor 20 returns to the original high level. During the time period T2, the phase difference between the frequency signals $\theta R$ and $\theta V$ is large and the discharging time period of the capacitor 20 is long, so that the terminal voltage V3 of the capacitor 20 decreases to a value lower than the threshold level of the delay type flip-flop 17. Accordingly, the $\overline{Q}$ output of the delay type flip-flop 17 is reversed to the high level in synchronism with the fall of the frequency signal $\theta R$ in the time period T2, thereby to indicate an unlocked state in the time period T3. The terminal voltage V3 of the capacitor is returned to the original high level responsive to the pickup signal V1 immediately after the end of the time period T2 and the capacitor 20 is not discharged in the time period T3 because there is no phase difference between the frequency signals $\theta R$ and $\theta V$, with the result that the terminal voltage V3 remains at the the high level. Accordingly, the $\overline{Q}$ output of the delay type flip-flop 17 is reversed to the low level in synchronism with the fall of the signal $\theta R$ in the time period T3.

As is apparent from the foregoing description, the storing operation of the unlocked state is achieved by the delay type flip-flop 17, which makes it possible to consider only the detection sensitivity in determining the capacitance value of the capacitor 20. Since the capacitance value of the capacitor 20 should be preferably selected to be small in order to improve the detection sensitivity, the inventive lock detecting circuit can improve the detection sensitivity and is suited for implementation in an integrated circuit, as compared with a conventional lock detecting circuit employing a low pass filter.

In the foregoing, the embodiment was described as discharging the capacitor 20 during a time period associated with the phase difference and charging the capacitor 20 in synchronism with the pickup signal V1 of the fall of the signal $\theta R$. Conversely, the inventive lock detecting circuit may be implemented such that the capacitor is charged for a time period associated with the phase difference and the capacitor is discharged in synchronism with the pickup signal V1. By way of modification, the clock input of the delay type flip-flop 17 may be a pulse signal obtainable by delaying the rise of the frequency signal $\theta R$. By way of a further modification, the pickup signal V1 and the clock input of the delay type flip-flop 17 may be obtained from the frequency signal $\theta V$. By way of a further modification, the detecting/storing circuit 17 may comprise another type of flip-flop, a sample hold circuit, or the like.

Figure 1:
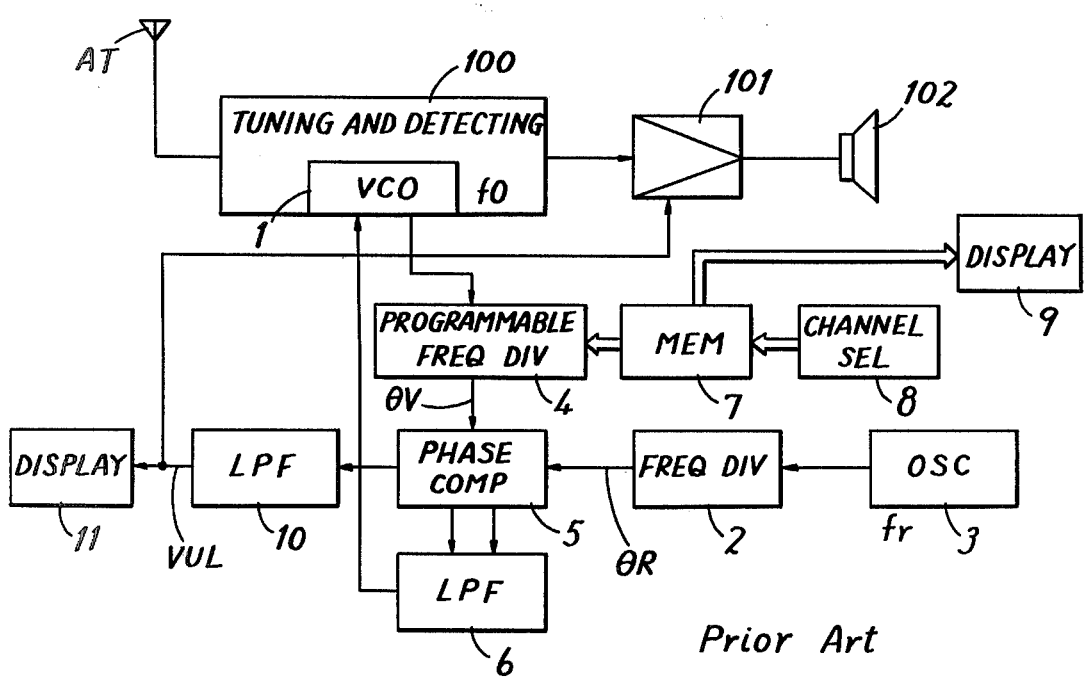
FIG. 1 shows a block diagram of a typical conventional radio receiver employing a frequency synthesizer.
Figure 2:
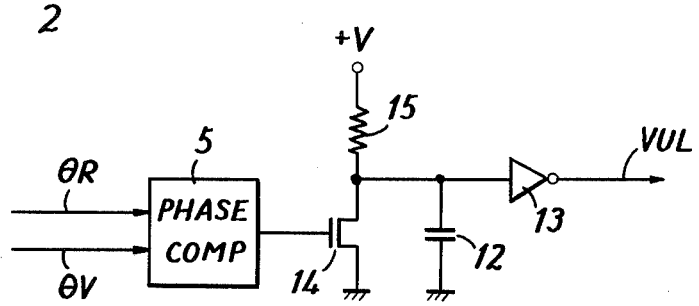
FIG. 2 shows a schematic diagram of a conventional lock detecting circuit employing a low pass filter.
Figure 6:
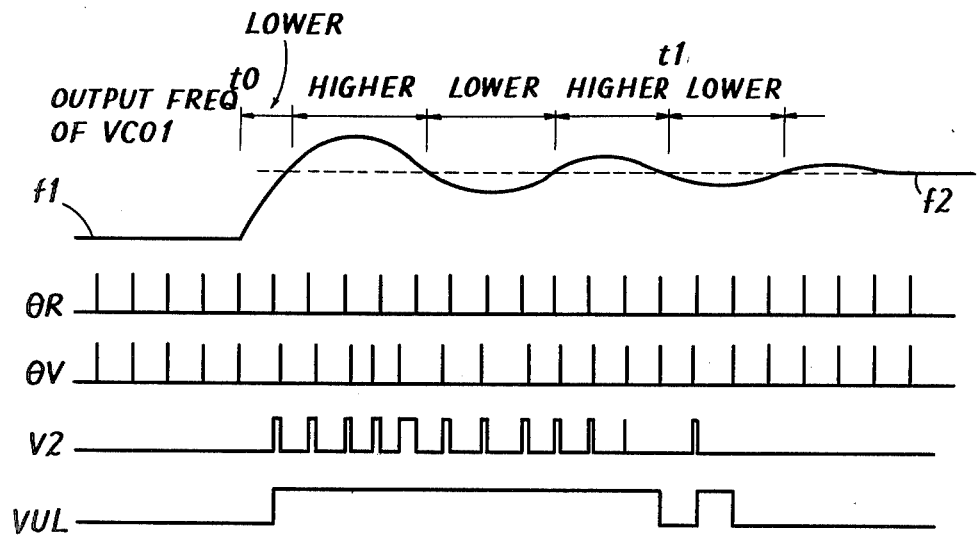
FIG. 6 shows wave forms of the electrical signals at various portions in the FIG. 4 embodiment in a macro-fashion.
Figure 7:
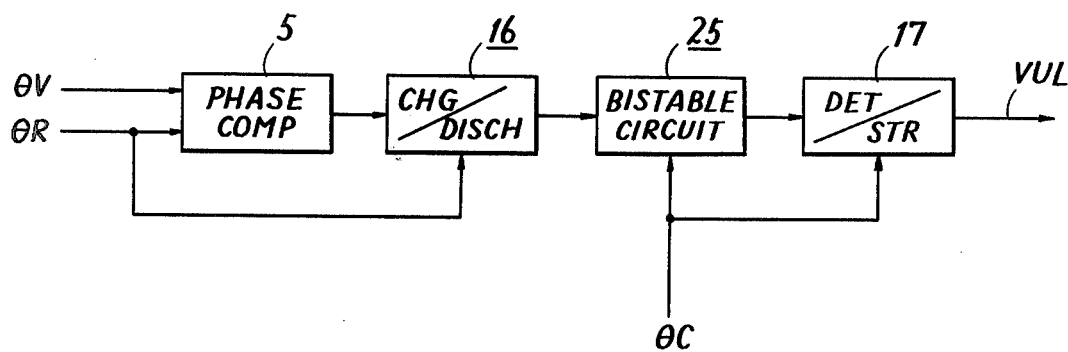
FIG. 7 shows a block diagram of another embodiment of the inventive lock detecting circuit.

FIG. 6 shows wave forms of the electrical signals in the FIG. 4 lock detecting circuit in a macro-fashion. Considering a change of the state wherein in the FIG. 1 phase locked loop the programmable frequency divider 4 has been set to a given frequency division rate and the phase locked loop has been locked at the output frequency f1 of the voltage controlled oscillator 1 to another state wherein the frequency division rate of the programmable frequency divider 4 is changed at the time point t0, the phase locked loop is again locked if and when the output frequency of the voltage controlled oscillator 1 reaches the value f2 corresponding to the new frequency division rate; however, the output frequency of the voltage controlled oscillator 1 does not gradually approach the frequency f2 but exhibits a transient response as shown in FIG. 6. More specifically, the output frequency of the voltage controlled oscillator 1 approaches the frequency f2 while the output frequency becomes higher and lower than the frequency f2. Accordingly, in such time period the phase difference between the frequency signals $\theta R$ and $\theta V$ becomes larger and smaller as shown as the signal V2. Accordingly, an inconvenience could be caused wherein the unlock detected output VUL is reversed to the low level because of no difference at the time point t1 in spite of the fact that in the time point t1 the output frequency of the voltage controlled oscillator 1 has not been stabilized to the frequency f2, whereupon the unlock detected output VUL becomes the high level. If the receiver employing the above described embodiment is structured to achieve a muting operation responsive to the said unlock detected output, then it follows that a harsh noise is heard from a speaker. FIG. 7 shows another embodiment of the inventive lock detecting circuit which comprises an improvement for eliminating the above described shortcomings. Briefly described, the FIG. 7 lock detecting circuit is characterized by a provision of a bistable circuit 25 receiving the output of the charging/discharging circuit 16 for detecting the phase difference and another frequency signal $\theta C$ the frequency of which is lower than those of the frequency signals $\theta R$ and $\theta V$, wherein the detection is made of whether or not the phase difference occurs during one cycle period of the signal $\theta C$ and detecting/storing circuit 17 is adapted to detect and store the output of the above described bistable circuit 25 in synchronism with the signal $\theta C$.

Figure 8:
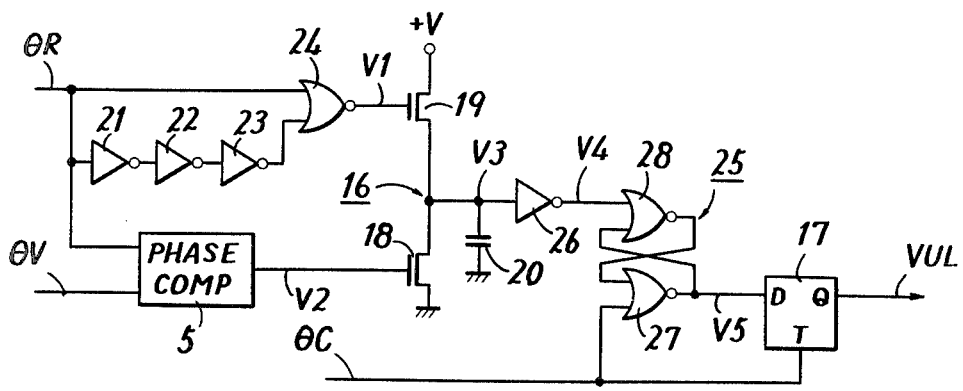
FIG. 8 shows a schematic diagram of the FIG. 7 embodiment.
Figure 9:
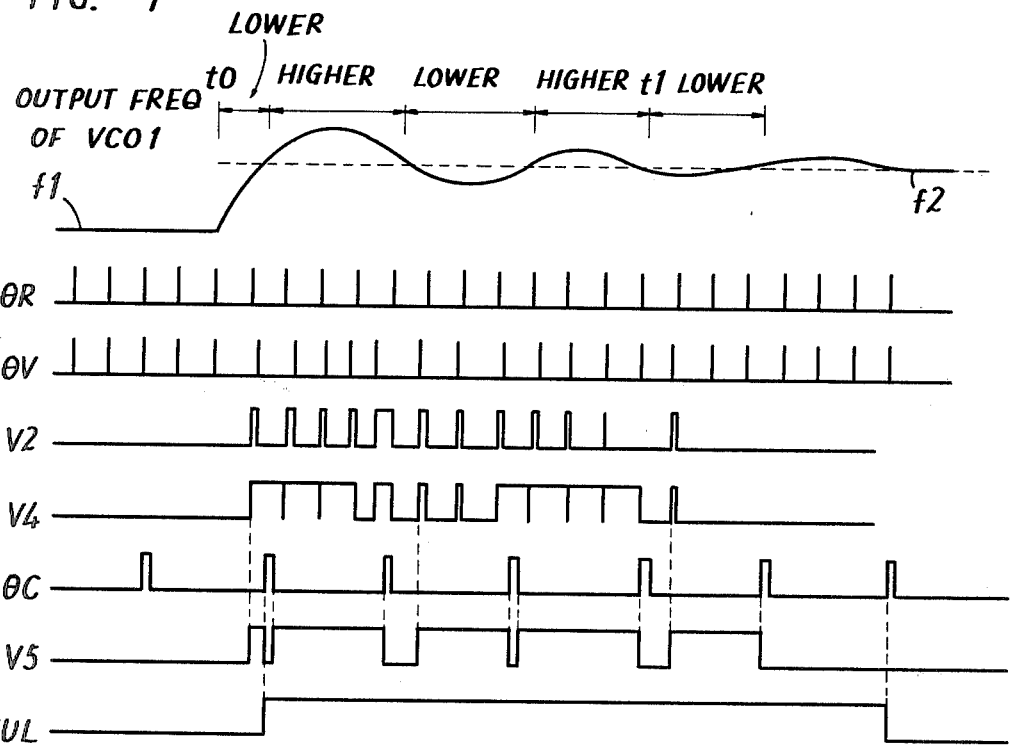
FIG. 9 shows wave forms of the electrical signals at various portions in the FIG. 8 embodiment.

FIG. 8 shows a schematic diagram of the FIG. 7 embodiment. Since the circuit configuration of the phase comparator 5, the charging/discharging circuit 16, and the detecting/storing circuit 17 is the same as that of the FIG. 4 lock detecting circuit, it is not believed necessary to describe the same again. The output of the charging/discharging circuit 16 is applied through an inverter 26 to a flip-flop 25 having a reset preferential function implemented by NOR gates 27 and 28. Such a flip-flop having a reset preferential function has been fully described in U.S. Pat. application, Ser. No. 853,584, entitled "Flip-flop having reset preferential function" and assigned to the same assignee as the present invention. The above referenced United States Patent Application is incorporated herein by referring to the same. The flip-flop of the aforesaid application is formed of an integrated circuit and includes a set input terminal and a reset input terminal. A clock signal source is operatively coupled through a field effect transistor to the set input terminal. A capacitance is formed at the gate electrode of the field effect transistor. There is also a charge control transistor which is controllable responsive to the clock signal for precharging the capacitance prior to the clock signal being applied. A discharge control transistor is provided which is responsive to a reset signal for discharging the capacitance. In this way, the capacitance is precharged prior to the clock signal and is discharged responsive to the reset signal. The field effect transistor is rendered conductive as a function of the charge on the capacitance and the clock signal source is operatively coupled to the set input terminal as a function of the conduction state of the field effect transistor whereby the flip-flop is set responsive to the leading edge of the clock signal and is reset responsive to the reset signal in preference to the clock signal. Other types of preferential reset flip-flops can be used, some of which are disclosed in the application. The capacitor 20 is charged in association with the phase difference between the frequency signals $\theta R$ and $\theta V$ and, if and when the terminal voltage V3 of the capacitor 20 becomes lower than the threshold level of the inverter 26, the output V4 of the inverter 26 is reversed to the high level. The above described reset preferential flip-flop 25 is set responsive to the said high level output, whereby the output becomes the high level. A noteworthy feature of the lock detecting circuit shown resides in detection of whether or not the phase difference between the frequency signals $\theta R$ and $\theta V$ occured at a cycle larger than those of the signals $\theta R$ and $\theta V$. Such feature will be described in more detail with reference to FIG. 9, which shows wave forms of the electrical signals at various portions in the FIG. 8 lock detecting circuit in a macro-fashion. If and when the signal V4 becomes the high level as a result of the phase difference between the frequency signals $\theta R$ and $\theta V$, the reset preferential flip-flop 25 is set and the output V5 becomes the high level. When the clock input $\theta C$ is applied to the delay type flip-flop 17, the state of the output of the reset preferential flip-flop 25 is detected by the delay type flip-flop 17 and is stored therein. More specifically, the output VUL of the delay type flip-flop 17 becomes the high level, thereby to indicate the unlocked state. The clock input $\theta C$ is also applied to the reset preferential flip-flop 25 and the reset preferential flip-flop 25 is reset responsive to the clock input $\theta C$, whereby the output becomes the low level. If the phase difference is detected even once until the following clock input $\theta C$ is applied, the reset preferential flip-flop 25 is again set, whereby the output VUL of the delay type flip-flop 17 also remains the high level.

Accordingly, even if the phase difference had not been detected at the time point t1, the output VUL of the delay type flip-flop 17 remains at the high level in the event that the phase difference is detected before the following clock input $\theta C$ is applied, with the result that the output VUL of the delay type flip-flop 17 remains at the high level until the output frequency f2 of the voltage controlled oscillator 1 is stabilized, thereby to achieve a prefered muting operation.

The signal $\theta C$ may be of a low frequency, say as low as 1/10, with respect to the frequencies of the frequency signals $\theta R$ and $\theta V$, and the signal $\theta C$ may not be a signal which is synchronised with the frequency signals $\theta R$ and $\theta V$. Although the signal $\theta C$ is preferably of a small pulse width, the signal $\theta C$ must be of a pulse width larger than the reversing time of the reset preferential flip-flop 25 and larger than a minimum clock pulse width required for the delay type flip-flop 17.

Now a lock detecting circuit for a phase locked loop employed in a multiband radio receiver will be described in the following. Considering a case of a radio receiver of two bands switchable between AM and FM bands, it is preferred that the frequency of the reference frequency signal $\theta R$ for phase comparison should also be changed in association with the difference of the local oscillation frequencies in both bands. More specifically, since the local oscillation frequency in the FM band is high, it is preferred that the frequency of the reference signal $\theta R$ for phase comparison be also selected to be high for precise phase comparison. Thus, in case where the frequency of the difference signal $\theta R$ for a phase comparison is changed in association with selection of the bands, it is necessary to change the detection sensitivity of the phase difference in association with the bands.

Now more detailed description will be made of an inconvenience which is encountered by a conventional lock detecting circuit employing a low pass filter utilized in a multiband radio receiver. According to the Japanese standard, the local oscillation frequency for AM broadcasting ranges from 990 KHZ to 2060 KHZ. Therefore, if the local oscillation frequency is frequency divided to 1/198 through 1/412 by means of the programmable frequency divider 4, then the signal $\theta V$ for the AM band becomes 5 KHZ. On the other hand, the local oscillation frequency for FM broadcasting ranges from 65.3 MHZ to 79.3 MHZ. Therefore, if the local oscillation frequency is frequency divided to 1/653 through 1/793 by means of the programmable frequency divider 4, then the signal $\theta V$ for the FM band becomes 100 KHZ. One approach to accommodate the above described frequency difference is to provide another frequency divider called a prescaler between the local oscillator and the programmable frequency divider for frequency dividing at a predetermined frequency rate of 1/20, thereby to convert the signal $\theta V$ for the FM band to 5 KHZ which is the same frequency for the AM band. However, according to such an approach, the side band becomes larger and the characteristic of the phase locked loop is degraded. Thus, if the signal $\theta V$ is changed in association with the frequency band, the frequency divider 2 for frequency dividing the output of the difference oscillator 3 must be provided for each frequency band to produce a signal $\theta R$ for each frequency band.

Assuming that in the AM band the signal $\theta V$ is 5 KHZ, the lock-up time of the phase locked loop is 20 m sec, the detection sensitivity of the unlock state is 1/1000 of one cycle of the signal $\theta V$, and the storing time is selected to be the same as the lock-up time, then the following equations are obtained.

$$\begin{aligned} RT \cdot C &= 1/5 \times 10^3 \times 1/10^3 \\ &= 0.2 \times 10^{-6} \\ &= 0.2 \ [\mu \ \text{sec}] \quad \text{(1) (discharge)} \\ R \cdot C &= 20 \ [\text{m sec}] \quad \text{(2) (charge)} \end{aligned}$$

Supposing that the practical values for RT, R and C are obtained from the equations (1) and (2), then $RT=10\Omega$, $R=1M\Omega$, and $C=0.02 \ \mu f$ are obtained, which means that it is extremely difficult to implement the invention in an integrated circuit, inasmuch as the registance value suited for implementation in an integrated circuit ranges from $10\Omega$ to $100 \ k\Omega$ and the capacitance value suited for implementation in an integrated circuit is less than 10 pF. If the signal $\theta V$ is selected to be 100 KHZ in the FM band, then implementation in an integrated circuit becomes more difficult. Therefore, the inventive lock detecting circuit of a phase locked loop for use in a multiband radio receiver is adapted such that a phase difference detecting means and a storing means are separately provided, while the reference frequency $\theta R$ is changed with respect to the frequency band and the detection sensitivity for the phase difference is accordingly changed with respect to the change of the reference frequency $\theta R$.

Figure 10:
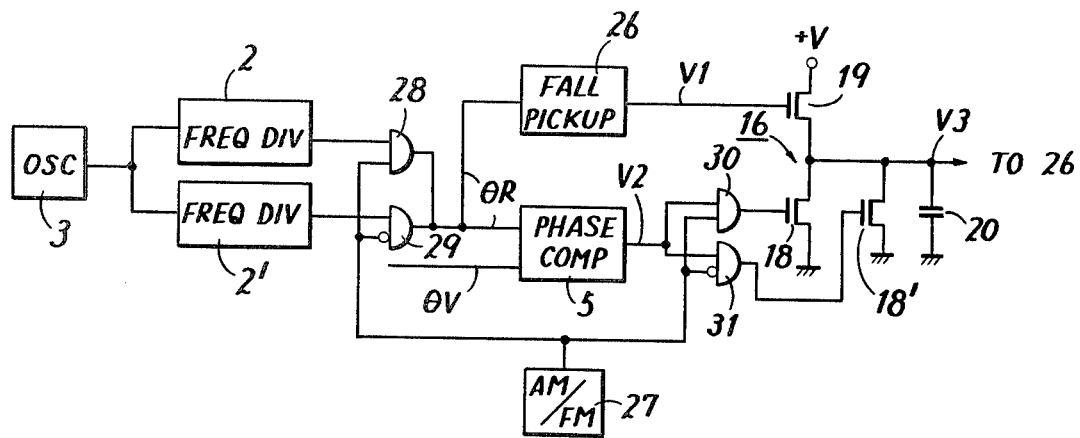
FIG. 10 shows a block diagram of another embodiment of the inventive lock detecting circuit of a phase locked loop employed in a multiband radio receiver.

FIG. 10 shows a block diagram of such a lock detecting circuit of a phase locked loop for use in a multiband radio receiver. Referring to FIG. 10, the frequency division rate of the frequency dividers 2 and 2' and the resistance values of the MOS transistors 18 and 18' when the same are in conduction are selected to be different and either frequency divider and either MOS transistor are selected through control of gates 28, 29, 30 and 31 responsive to the output of a band switching circuit 27. Although the FIG. 10 embodiment has been structured such that the detection sensitivity, i.e. the discharging time constant of the capacitor is changed in association with the band through selection of the MOS transistors that have different conduction resistance values, alternatively the embodiment may be structured such that capacitors having different capacitance values are selected responsive to band switching. The embodiment is also shown comprising a circuit 26 for providing a pickup signal of the fall of the frequency signal θR, which may be implemented by inverters and a NOR gate, as shown in FIG. 8.

As is clear from the foregoing description, according to the inventive lock detecting circuit of a phase locked loop, detection of the phase difference, i.e. an unlocked state and storage of the unlocked state are achieved by separate means. Therefore, the detection sensitivity can be fully enhanced as compared with a conventional lock detecting circuit employing a low pass filter. Since the capacitance of a capacitor determining the detection sensitivity can be made small, the inventive lock detecting circuit is easy of implementation in an integrated circuit. According to another feature of the present invention, detection and storage of an unlocked state are achieved in synchronism with a frequency signal the frequency of which is lower than that of the frequency signals θR and θV. Therefore, the unlock detected output is not changed until the phase locked loop is fully stabilized, with the result that a preferred muting operation is achieved.

Although in the foregoing, the present invention was described by taking an example of a frequency synthesizer radio receiver, it is pointed out that the present invention can be equally applicable to a television receiver employing a frequency synthesizer.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:
1. A phase comparing apparatus, comprising;
    means for providing a first frequency signal of a reference frequency,
    means for providing a second frequency signal of a frequency or phase being compared with that of said first frequency signal,
    phase comparator means responsive to said first and second frequency signal providing means for comparing the frequencies or phases of said first and second frequency signals for providing an output representative of a frequency difference or a phase difference between said first and second frequency signals,
    charging/discharging circuit means responsive to one of said first and second frequency signal providing means for being forced to one of the charged and discharged states and responsive to the output of said phase comparator means for being forced toward the other of the charged and discharged states at a predetermined time constant as a function of said output of said phase comparator means, and state storing means coupled to said charging/discharging circuit means and said one of said first and second frequency signal providing means and responsive to a predetermined level between said one and said other of the charged and discharged states of said charging/discharging circuit means and said one of said first and second frequency signals for assuming one storing state for providing an output representative of the frequency difference or phase difference between said first and second frequency signals.

2. A phase comparing apparatus in accordance with claim 1, which further comprises
    first frequency changing means coupled to said first frequency signal providing means for changing the frequency of said first frequency signal,
    second frequency changing means coupled to said second frequency signal providing means for changing the frequency of said second frequency signal, and
    means coupled to said charging/discharging circuit means and responsive to said first and second frequency changing means for changing said predetermined time constant of said charging/discharging circuit means.

3. A phase comparing apparatus in accordance with claim 1, wherein said second frequency signal providing means comprises voltage controlled oscillating means responsive to a voltage control signal for oscillating at a frequency associated with said voltage control signal, and the output of said phase comparator means is applied to said voltage controlled oscillating means as a voltage control signal, whereby a phase locked loop is constituted.

4. A phase comparing apparatus in accordance with claim 3, wherein said voltage controlled oscillating means is employed as local oscillating means in a receiving apparatus.

5. A phase comparing apparatus in accordance with claim 4, wherein said receiving apparatus comprises a multiband receiving apparatus comprising means for selecting a frequency band, means operatively coupled to said frequency band selecting means for changing the frequencies of said first and second frequency signals, and means operatively coupled to said charging/discharging circuit means and responsive to said frequency band selecting means for changing said predetermined time constant of said charging/discharging circuit means.

6. A phase comparing apparatus in accordance with claim 4, wherein further comprises means operatively coupled to said state storing means for displaying the frequency difference or phase difference between said first and second frequency signals.

7. A phase comparing apparatus in accordance with claim 4, which further comprises means responsive to said state storing means for disabling said receiving apparatus.

8. A phase comparing apparatus in accordance with claim 1, wherein said charging/discharging circuit means comprises
    charge storing means,
    first switching means operatively coupled to said charge storing means and responsive to said one of said first and second frequency signal providing means for being rendered conductive for forcing said charge storing means to one of the charged and discharged states, and
    second switching means operatively coupled to said charge storing means and responsive to said phase comparator means for being rendered conductive for forcing said charge storing means to the other of the charged and discharged states at said predetermined time constant.

9. A phase comparing apparatus in accordance with claim 1, wherein said state storing means comprises means coupled to said charging/discharging circuit means for level detecting the output of said charging/discharging circuit means at said predetermined level between said one and said other of the charged and discharged states of said charging/discharging circuit means.

10. A phase comparing apparatus in accordance with claim 8, wherein said first and second switching means each comprise a field effect device.

11. A phase comparing apparatus, comprising:
means for providing a first frequency signal of a reference frequency,
means for providing a second frequency signal of a frequency or phase being compared with that of said first frequency signal,
phase comparator means responsive to said first and second frequency signal providing means for comparing the frequencies or phases of said first and second frequency signals for providing an output representative of a frequency difference or a phase difference between said first and second frequency signals,
charging/discharging circuit means responsive to one of said first and second frequency signal providing means for being forced to one of the charged and discharged states and responsive to the output of said phase comparator means for being forced toward the other of the charged and discharged states at a predetermined time constant as a function of said output of said phase comparator means, and
means for providing a third frequency signal of a frequency lower than those of said first and second frequency signals,
first state storing means coupled to said charging/discharging circuit means and said third frequency signal providing means and responsive to a predetermined level between said one and said other of charged and discharged states of the charging/discharging circuit means for assuming a first storing state and responsive to the third frequency signal for assuming a second storing state, and
second state storing means responsive to the output of the first state storing means and the third frequency signal for assuming one storing state for providing an output representative of the frequency difference or phase difference between the first and second frequency signals.

12. A phase comparing apparatus in accordance with claim 11, which further comprises
first frequency changing means coupled to said first frequency signal providing means for changing the frequency of said first frequency signal,
second frequency changing means coupled to said second frequency signal providing means for changing the frequency of said second frequency signal, and
means coupled to said charging/discharging circuit means and responsive to said first and second frequency changing means for changing said predetermined time constant of said charging/discharging circuit means.

13. A phase comparing apparatus in accordance with claim 11, wherein said second frequency signal providing means comprises voltage controlled oscillating means responsive to a voltage control signal for oscillating at a frequency associated with said voltage control signal, and the output of said phase comparator means is applied to said voltage controlled oscillating means as a voltage control signal, whereby a phase locked loop is constituted.

14. A phase comparing apparatus in accordance with claim 13, wherein said voltage controlled oscillating means is employed as local oscillating means in a receiving apparatus.

15. A phase comparing apparatus in accordance with claim 14, wherein said receiving apparatus comprises a multiband receiving apparatus comprising means for selecting a frequency band, means operatively coupled to said frequency band selecting means for changing the frequencies of said first and second frequency signals, and means operatively coupled to said charging/discharging circuit means and responsive to said frequency band selecting means for charging said predetermined time constant of said charging/discharging circuit means.

16. A phase comparing apparatus in accordance with claim 14, which further comprises means operatively coupled to said second state storing means for displaying the frequency difference or phase difference between said first and second frequency signals.

17. A phase comparing apparatus in accordance with claim 14, which further comprises means responsive to said second state storing means for disabling said receiving apparatus.

18. A phase comparing apparatus in accordance with claim 11, wherein said charging/discharging circuit means comprises
charge storing means,
first switching means operatively coupled to said charge storing means and responsive to said one of said first and second frequency signal providing means for being rendered conductive for forcing said charge storing means to one of the charged and discharged states, and
second switching means operatively coupled to said charge storing means and responsive to said phase comparator means for being rendered conductive for forcing said charge storing means to the other of the charged and discharged states at said predetermined time constant.

19. A phase comparing apparatus in accordance with claim 11, wherein said first state storing means comprises means coupled to said charging/discharging circuit means for level detecting the output of said charging/discharging circuit means at said predetermined level between said one and said other of the charged and discharged states of said charging/discharging circuit means.

20. A phase comparing apparatus in accordance with claim 18, wherein said first and second switching means each comprise a field effect device.

* * * * *